(12) United States Patent
Sadayama

(10) Patent No.: US 6,686,600 B2
(45) Date of Patent: Feb. 3, 2004

(54) TEM SAMPLE SLICING PROCESS

(75) Inventor: Shoji Sadayama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/005,034

(22) Filed: Dec. 4, 2001

(65) Prior Publication Data

US 2002/0074496 A1 Jun. 20, 2002

(30) Foreign Application Priority Data

Dec. 6, 2000 (JP) .......................... 2000-371829

(51) Int. Cl.$^7$ ................................ H01J 37/20
(52) U.S. Cl. .................. 250/492.21; 250/307; 250/311; 250/309; 250/306; 250/492.2; 438/691; 438/460
(58) Field of Search ............................ 250/492.21, 307, 250/311, 309, 306, 492.2; 438/691, 460

(56) References Cited

U.S. PATENT DOCUMENTS 5,333,495 A * 8/1994 Yamaguchi et al. .......... 73/105
6,080,991 A * 6/2000 Tsai ..................... 250/492.21
6,188,068 B1 * 2/2001 Shaapur et al. ............. 250/307
6,194,720 B1 * 2/2001 Li et al. ..................... 250/311

* cited by examiner

Primary Examiner—John R. Lee
Assistant Examiner—Zia R Hashmi
(74) Attorney, Agent, or Firm—Adams & Wilks

(57) ABSTRACT

The present invention adopts a TEM sample slicing process for observation of a specified point on a cross section of a wafer shaped sample, comprising a step of depositing a thick protection film on the sample surface at regions of the cross section to be observed, a step of hollowing out a large hole in front of the regions of the cross section to be observed, a step of forming hollowing out a hole behind the regions of the cross section to be observed and forming slicing process sections, and following on from that, executing slicing processing by setting irradiation regions at regions including the center of the slicing process section and irradiating a focused ion beam from above the sample surface, using angle of incidence characteristics of etching rate due to a focused ion beam.

11 Claims, 6 Drawing Sheets

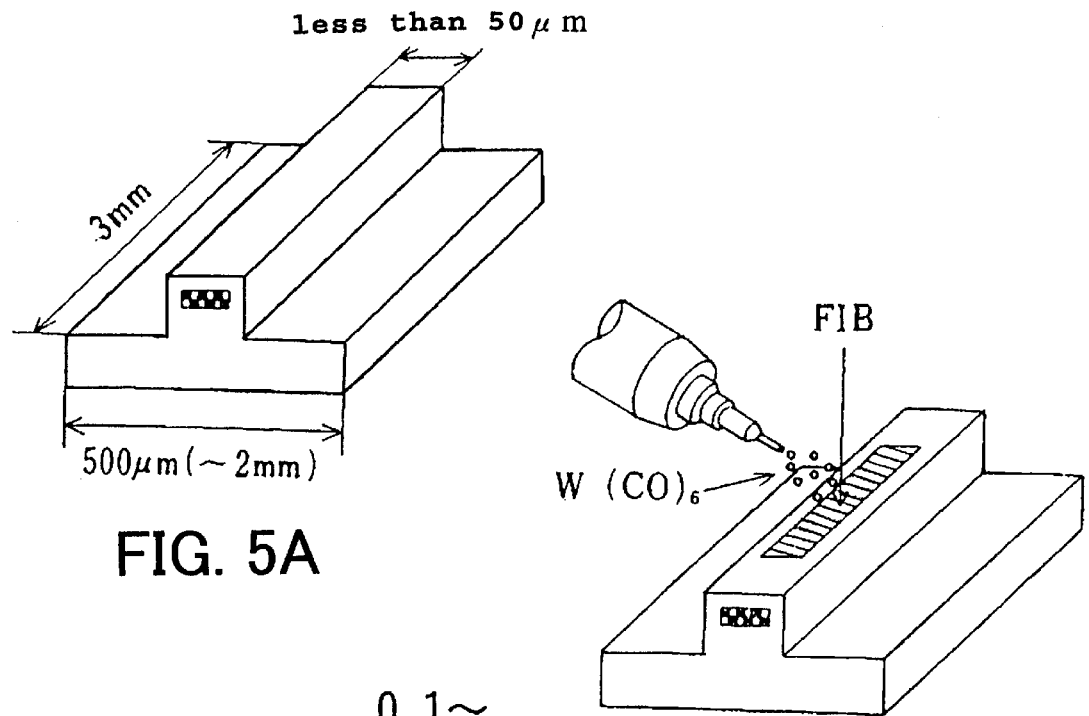
FIG. 5A
FIG. 5B
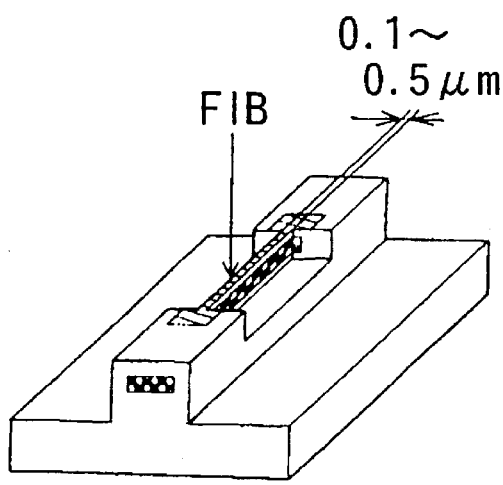
FIG. 5C
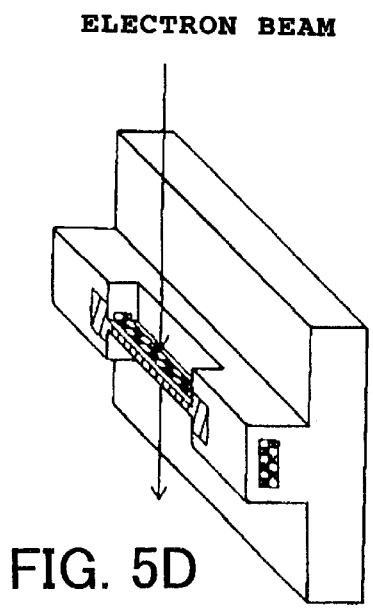
FIG. 5D

TEM SAMPLE SLICING PROCESS

BACKGROUND OF THE INVENTION

The present invention relates to a technique for processing a slice sample for a transmission electron microscope (TEM) using a focused ion beam device.

A sample for a transmission electron microscope is to be observed as an image of an object through which electrons have passed, which means that there is a need to process that sample to an extent that it becomes extremely thin. Production of a cross sectional sample such as a wafer by a slicing process using a focused ion beam device as shown in FIG. 6 is well known, and the following two processes are well known.

1) Mechanically cutting away a small piece form a wafer-shaped sample as shown in FIGS. 5A—5C and processing this piece.
2) Subjecting a wafer directly to etching with a focused ion beam device, and cutting away a sliced sample.

The former process involves (FIG. 5(a)) first of all cutting a small block having a width of 500 μm–2 mm and a length of 3 mm from a wafer to be sampled and then performing mechanical processing to shave off a an upper section by a further 50 μm or less (FIG. 5(b)) spraying an aromatic gas or W(CO) 6 using a gas gun 14 onto central process sections of this small block to form a protective film (FIG. 5(c)). After that, a focused ion beam is irradiated to carry out slicing processing, and (FIG. 5(d)) the sliced sample is used as a cross sectional sample for TEM observation by passing an electron beam. The not yet processed sections of the small block also serve as a sample platform. The latter process is not a mechanical process, and executes focused ion beam processing from a direct wafer using a focused ion beam device. This method involves first of all forming a protective film on processing sections using a gas gun 14. A focused ion beam 12 is irradiated from above to the surface of the sample 1, both sides of the observation cross section are shaved off using a sputtering process, as will be understood from FIG. 4, and square holes 3, 4 are formed in both sides of flake sections 2 of the observation cross section. The size of the holes is such that the front hole 3 is of a size that allows the sample cross section to be observed with a scanning ion microscope by titling the sample platform, and the rear hole 4 is of a size the width is the same as that of the front hole 3 while the depth is ⅔ that of the front hole 3. FIG. 4 is a microscope observation subject looking from diagonally above the slice process sections 2 of a sample 1 with a scanning ion microscope.

With the method of mechanically cutting away a small piece and processing this piece as in method 1) noted above, and with the method of subjecting a wafer directly to etching and cutting away a sliced sample as in method 2), noted above, the method for final slicing processing is carried out by irradiating a focused ion beam from above towards one end of the sliced sample. This processing is finishing processing, and since it is desirable to make the damage caused by the focused ion beam extremely low, lately it is being carried out with a low acceleration voltage. However, this processing with a low acceleration voltage has a slow etching rate and thus a long processing time, and also a problem in that beam sag becomes large, positional precision of the beam is lowered causing degradation in image resolution, and processing region setting becomes difficult.

Incidentally, beam sag in the case of beam irradiation with a low acceleration voltage of 8 kV results in a positional deviation of about 0.4 μm with respect to the set position. However, with a focused ion beam, constriction of ion flow into a beam shape is such that actual ion beam density has a peak in the beam center and a gaussian distribution at the periphery, as shown in FIG. 2. Accordingly, the related art is directed to processing in which a focused ion beam is irradiated from above towards an end of a slice processing section 2 and finally subjected to slicing processing, and a deviated part of this is anticipated and scanning regions in front of a processing surface are set so that sections where the ion beam density is extremely high are not irradiated to the top surface of the sliced sample. An irradiation region SA in the case shown in FIG. 1A is execution of positional setting with an estimated beam sag from the surface of the slice processing section 2 of 0.4 μm. Because of this, as will be clear from the ion density distribution of FIG. 2, this processing does not use a peak value of an ion beam having good processing efficiency (high etching rate), and processing becomes executed using edge sections of the beam. This means that processing time is prolonged which is inefficient.

SUMMARY OF THE INVENTION

The present invention is directed to a method for executing slicing processing of a sample using a focused ion beam device, and has as its feature to provide a method, in an operation with a low acceleration voltage, that can carry out processing in a short time without beam sag.

The present invention adopts a TEM sample slicing process for observation of specified points on a cross section of a wafer-shaped sample, comprising a step of depositing a thick protection film on the sample surface at regions of the cross section to be observed, a step of hollowing out a large hole in front of the regions of the cross section to be observed, a step of forming hollowing out of a hole behind the regions of the cross section to be observed and forming slicing process sections, and following on from that, executing slicing processing by setting irradiation regions at regions including the slicing process section at the center and irradiating a focused ion beam from above the sample surface, using an angle of incidence/etching rate characteristic for a focused ion beam.

BRIEF DESCRIPTION OF THE DRAWINGS

FIGS. 5A–5D are drawings used for describing conditions for executing direct slice processing from a wafer using a focused ion beam device after mechanically cutting a small piece.

DETAILED DESCRIPTION OF THE INVENTION

Figure 3:
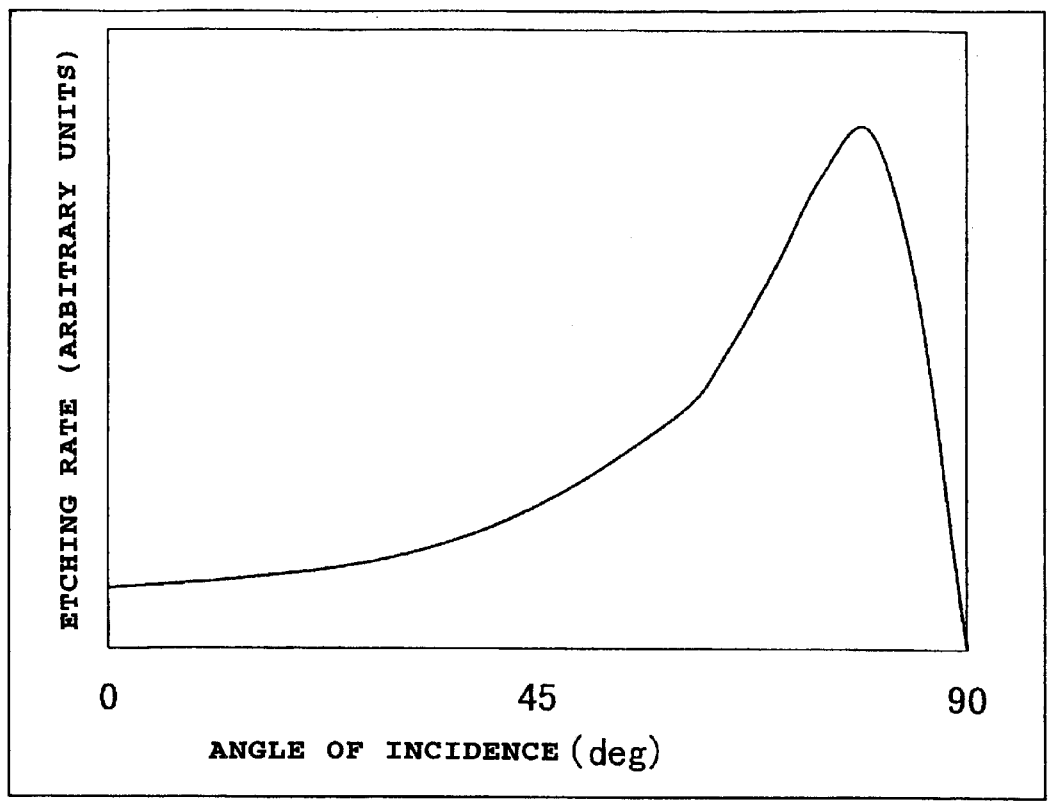
FIG. 3 is a drawing showing an etching rate/angle of incidence characteristic for the focused ion beam.

Basically, the present invention makes effective use of an etching rate/angle of incidence characteristic for a focused ion beam shown graphically in FIG. 3. The fact that etching rate of a focused ion beam is higher for a large angle of incidence than for a small angle of incidence is well known. As shown in this graph, a beam parallel to the process surface can not contribute to etching, but etching rate varies with angle and suddenly rises to a peak close to an angle of incidence of 80 degrees, and from there decreases quite rapidly up to 60 degrees, decreases more gradually to 30 degrees, and decreases very gradually from 30 degrees to 0 degrees. Specifically, with respect to the sample surface, considering that etching rate of an ion beam from directly above is obviously not high, in etching the top surface 21 of a slice processing section 2 using ion beam irradiation close to an angle of incidence of 80 degrees, the present invention confidently assumes irradiation of a focused ion beam from immediately above towards the top surface 21 of the slice process section 2 without absolute conditions to be avoided as in the related art. However, the etching rate with ion beam irradiation close to this angle of incidence of 0 degrees is much lower compared to the etching rate with ion beam irradiation with a peak value close to an angle of incidence of 80 degrees, but there is no guarantee that there will be no damage to the sample if the amount of accumulation during processing is considered. With the present invention, a thick protective film DG is formed in advance on a top surface 21 of the slice process section 2, thus avoiding damage to the top surface of the slice process region by the ion beam irradiation close to an incident angle of 0 degrees.

Figure 1A:
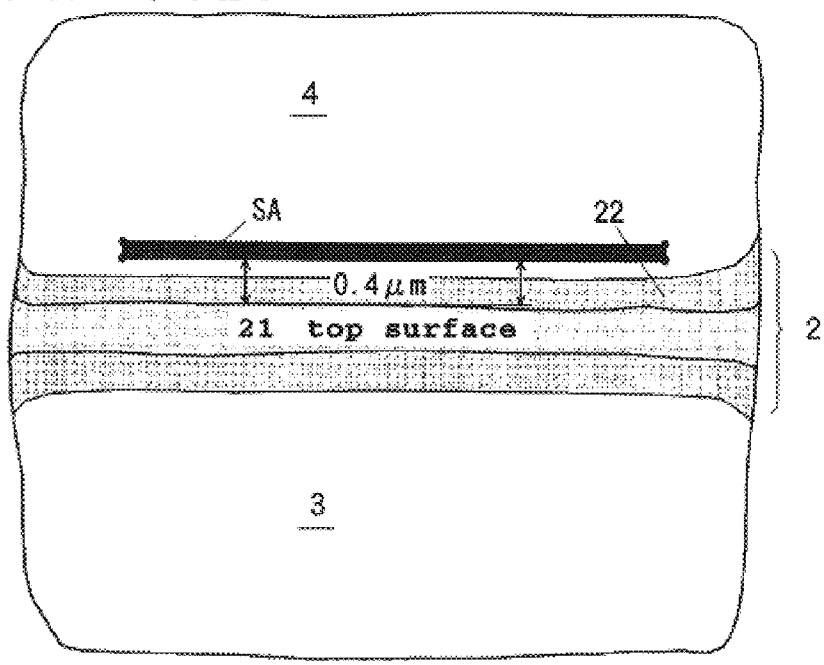
FIG. 1 is a drawing for describing ion bean irradiation region setting for slice finishing processing, with A showing ion beam irradiation region setting in the related art and B showing ion beam irradiation region setting of the present invention.
Figure 1B:
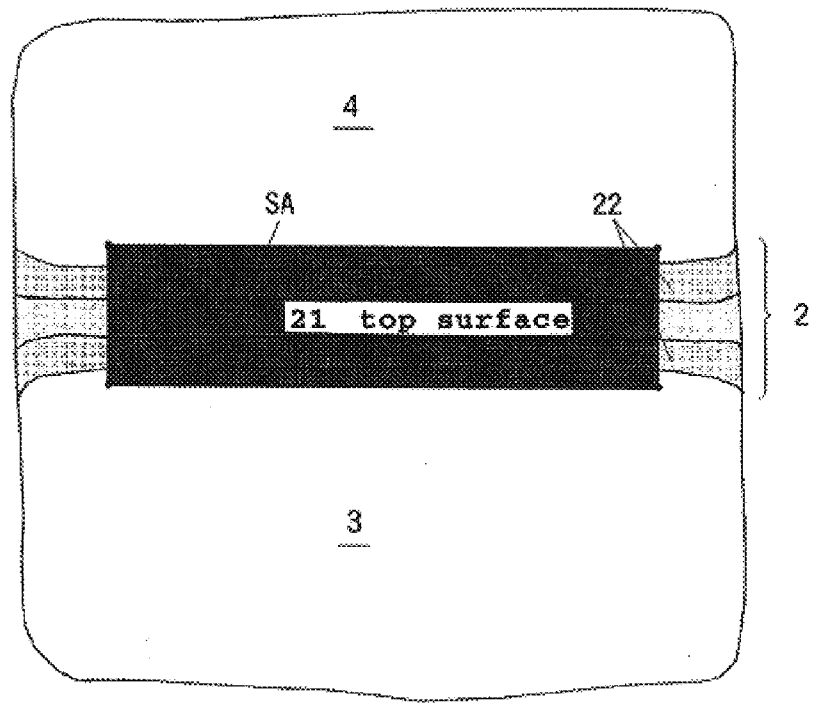
Figure 2:
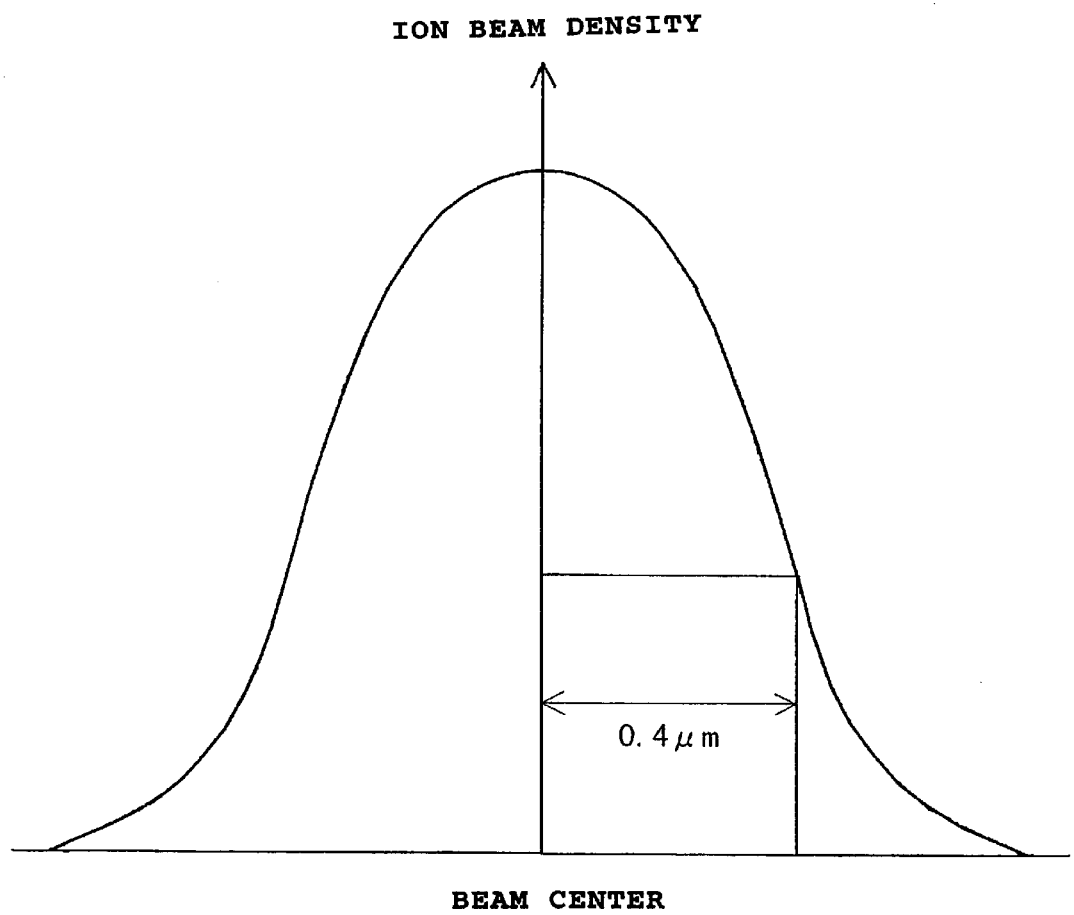
FIG. 2 is a drawing showing beam density distribution of the focused ion beam.

A setting state of an irradiation region SA of the present invention is shown in FIG. 1B. A region to be irradiated of the entire slice processing section 2 is set without worrying about irradiation of a beam to the top surface 21 of the slice processing section 2 as in the related art. In this case also, if irradiation is carried out with a low acceleration voltage, beam sag of about 0.4 um arises in the ion beam, similarly to the related art, and there is positional slippage in positional control for scanning by deflection means of an ion optical system 11 by that sag amount. However, the beam in the case of the present invention uses a central part where ion beam density is extremely high as shown in FIG. 2, which means that beam energy becomes extremely high. An etching rate of a beam from above then becomes an extremely high value because the two process surfaces having the condition of the sloping surface 22 are close to an angle of incidence of 80 degrees, as opposed to the low value for the top surface 21 of the slice processing section 2 close to an incident angle of 0 degrees, as shown in FIG. 3. Accordingly, at the time of processing, processing of both processing surfaces can be carried out at the same time, and processing with good efficiency is performed taking advantage of the angle of incidence characteristic of the ion beam etching rate. With respect to the top surface 21, the etching rate of items irradiated with an ion beam is always low during processing, and it is possible to adequately prevent damage by the simple measure of depositing a thick protection film. This means that adoption of the processing method of the present invention can be expected to reduce processing time compared to the inefficient processing time of the related art. This processing time is also different depending on the type and structure of the sample to be processed, which means that at the time of actual processing basic data is extracted for the sample and processing time etc. is set.

[Embodiment 1]

An embodiment of the present invention is shown for producing a semiconductor wafer for a transmission electron a microscope that is cross sectionally sliced at a specified location.

1) A wafer-shaped 64M DRAM is mounted on a sample platform of a focused ion apparatus, and positioned so that when a beam is irradiated above the wafer surface specified parts constituting the sample for TEM observation are at irradiation positions. Specific locations of the wafer are specified, and a focused ion beam is irradiated while spraying phenanthrene gas from a gas gun to the surface of those sections to deposit a thick carbon protective film.

Figure 4:
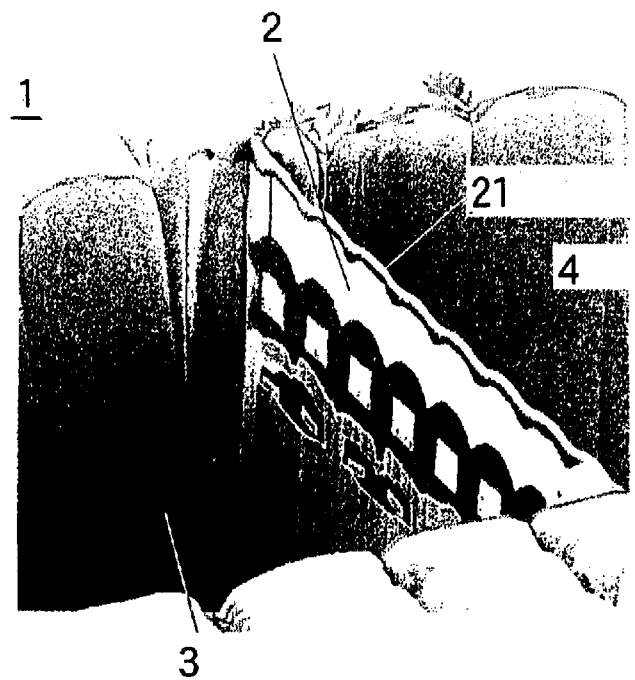
FIG. 4 is a drawing showing conditions for executing direct slice processing from a wafer using a focused ion beam device.
Figure 6:
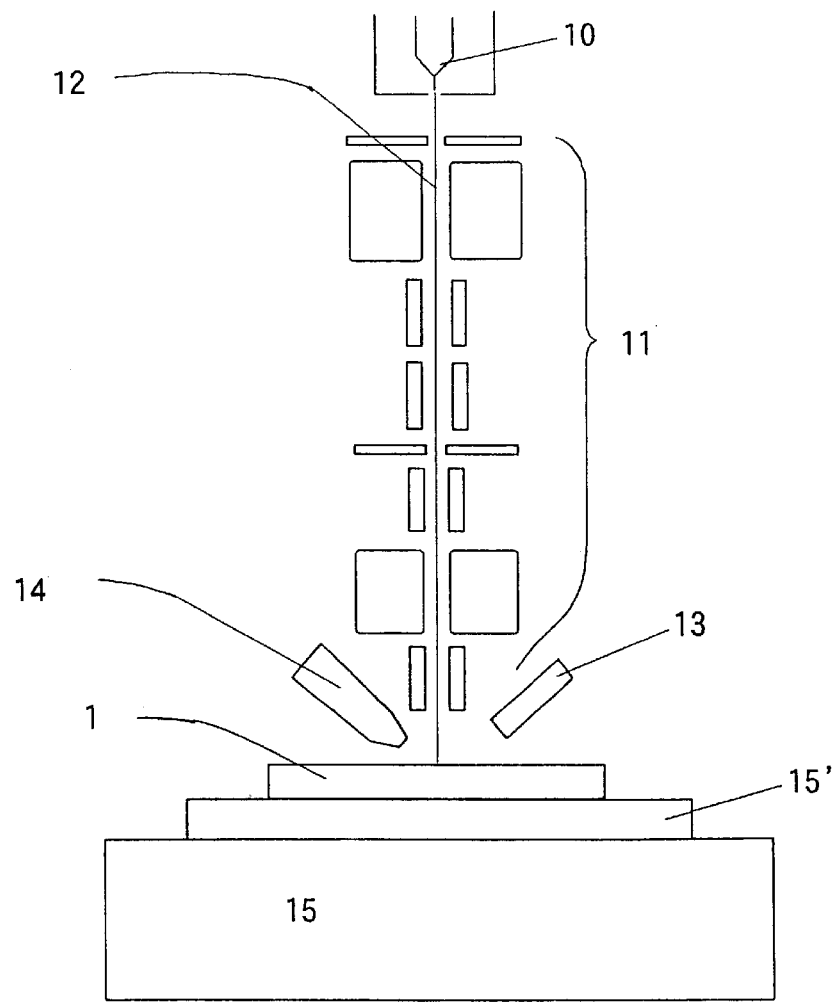
FIG. 6 is a drawing showing the schematic structure of a focused ion beam device used in the present invention.

2) Both sides of the specified observational cross section are etched to the shape shown in FIG. 4 (front hole 3 having a width of 20 $\mu$m a length of 20 $\mu$m and a depth of 10 $\mu$m, rear hole 4 having a width of 20 $\mu$m a length of 10 $\mu$m and a depth of 10 $\mu$m) by ion beam irradiation from above the wafer surface. This processing is coarse cutting, and is carried out with a high acceleration voltage of 30 kV. At the time of this processing, the sample platform 60 is tilted at an angle of 60 degrees while confirming if the specified cross section locations are appearing with the microscope image. The thickness of the top surface 21 (deposition layer) of the slice processing section upon completion of this processing is about 0.2 $\mu$m, and the upper part of the sample section has a thickness of 0.58 $\mu$m at central observation sections below 0.45 $\mu$m.

3) Continuing on, as shown in FIG. 1B, an irradiation region SA (8 $\mu$m×2.25 $\mu$m) is set, and finishing processing for the observational cross-section slice is carried out using the focused ion beam from above the wafer surface. This finishing processing is not only to prevent damage at the time of processing the front hole 3 and the rear hole 4 and damage to the scattered and adhered elements, but is also execution of further slicing, and this slicing finishing processing lowers the acceleration voltage to 8 kV and is executed until the thickness of the slice sample observational cross section becomes 0.11 $\mu$m. Incidentally, observing the processed situation when this process has been executed for 300 seconds, the thickness of the top surface 21 of the slice process section 21 is about 0.11 $\mu$m, and the upper part of the sample section has a thickness of 0.48 $\mu$m at central observation sections 0.35 $\mu$m below, namely, the sample surface is removed to an extent of about 0.1 $\mu$m in 300 seconds.

Focused ion beam irradiation is carried out not from directly above the sample surface (at an angle of 0 degrees) but tilted by 3 degrees with respect to the sample surface. This is not processing under the same condition for both sides of the slice process sections, and an angle of incidence having an extremely high etching rate for the process surface is selected from the characteristic shown in FIG. 3, and processing is performed efficiently one side at a time. For one, there is processing with irradiation for 300 seconds at a three degree tilt giving priority to one side, and then processing with irradiation for 30 seconds with a 3 degree tilt giving priority to the other side surface. As a result of this process, a total of 0.1 $\mu$m is removed from the two surfaces. In the related art processing method, it was necessary to carry out end processing every 20 minutes, and so the processing time is reduced by 30 minutes, that is, the processing time can be reduced to ¼.

4) With completion of the above described operation a notch is cut, this slice processed sample is completely separated from the sample body 1 as a sliced sample, mounted on a sample fixing platform and completed as a sample for a transmission electron microscope. The operation time up to this point can be brought down to about 70 minutes.

The present invention is a TEM sample slicing process for observation of specified point on a cross section of a wafer shaped sample, comprising a step of depositing a thick protection film on the sample surface at regions of the cross section to be observed, a step of hollowing out a large hole in front of the regions of the cross section to be observed, a step of forming hollowing out a hole behind the regions of the cross section to be observed and forming slicing process sections, and carrying out-slice process finishing processing by irradiating a focused ion beam from above a sample at slice processing sections, in which slicing processing is performed by setting an irradiation region in a wide region including in the center of the slicing process section at the time of finishing processing and irradiating a focused ion beam from above the sample in the center, and this means that as well as being able to use sections where the ion beam density is high, it is possible to execute efficient etching processing taking advantage of an angle of incidence/etching rate characteristic of the ion beam and it is possible to reduce processing time and simply carry out irradiation region setting.

What is claimed is:

1. A sample slicing process for obtaining a Transmission Electron Microscope (TEM) sample which is used for TEM observation of the cross section of a desired area of a sample, comprising the steps of:

depositing a thick protection film on the sample surface at regions where the cross section of the sample is to be observed using a TEM;

forming sections to be sliced by hollowing out a hole in front of and a hole behind the regions where the cross section of the sample is to be observed using a focused ion beam set such that a center section of the beam is irradiated onto a top surface of a respective section to be sliced; and executing a slicing process by irradiating the focused ion beam onto the sample surface.

2. A sample slicing process according to claim 1; wherein the step of executing a slicing process is performed by varying an angle of incidence of the focused ion beam onto the sample surface by tilting the sample in forward and reverse directions with respect to the focused ion beam so as to process both surfaces of the section to be sliced.

3. A sample slicing process according to claim 1; wherein the step of forming sections by hollowing out the holes in front of and behind the regions of the sample to be observed is performed using a focused ion beam having a relatively high accelerating voltage; and the step of executing the slicing process by irradiating the focused ion beam is performed with a relatively low accelerating voltage of the focused ion beam.

4. A sample slicing process according to claim 2; wherein the step of forming sections by hollowing out the holes in front of and behind the regions of the sample to be observed is performed using a focused ion beam having a relatively high accelerating voltage; and the step of executing the slicing process by irradiating the focused ion beam is performed with a relatively low accelerating voltage of the focused ion beam.

5. A sample slicing process according to claim 1; wherein the step of executing a slicing process is performed with a focused ion beam directed to the sample at an angle of incidence of about 60°.

6. A sample slicing process according to claim 1; wherein the step of executing a slicing process is performed with a focused ion beam directed to the sample at an angle of incidence of at least 30°.

7. A method for processing a sample to obtain a cross section observable by a transmission electron microscope, comprising the steps of:

depositing a thick protective film on a surface of the sample at a desired region where the cross section is to be observed;

forming holes on opposite sides of the desired region using a focused ion beam with a high acceleration voltage by irradiating the sample with the focused ion beam such that a center section of the focused ion beam is irradiated directly onto a top surface of the desired region; and forming a thin cross-section of the sample observable by transmission electron microscope at the desired region by irradiating the sample with the focused ion beam.

8. A method for processing a sample according to claim 7; wherein the step of forming a thin cross-section of the sample is performed with an angle of incidence of the focused ion beam onto the sample surface being varied by tilting the sample in forward and reverse directions with respect to the focused ion beam so as to process opposite sides of the thin cross-section.

9. A method for processing a sample according to claim 7; wherein the step of forming holes on opposite sides of the desired regions is performed with a focused ion beam directed to the sample at an angle of incidence of at least 30°.

10. A sample slicing process according to claim 1; wherein the step of depositing a thick protection film comprises depositing the protective film with a thickness sufficient to prevent etching of the sample thereunder during the step of hollowing out holes in front of and behind the regions where the cross section of the sample is to be observed.

11. A method for processing a sample according to claim 7; wherein the step of depositing a thick protective film comprises depositing the protective film with a thickness sufficient to prevent etching of the sample thereunder during the step of forming holes on opposite sides of the desired regions.

* * * * *